United States Patent
Block et al.

(10) Patent No.: US 7,741,913 B2
(45) Date of Patent: Jun. 22, 2010

(54) LOW-LOSS ELECTRICAL COMPONENT WITH AN AMPLIFIER

(75) Inventors: Christian Block, Stainz (AT); Miguel Falagan, Munich (DE); Holger Flühr, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 11/917,590

(22) PCT Filed: May 10, 2006

(86) PCT No.: PCT/EP2006/004398

§ 371 (c)(1),
(2), (4) Date: May 27, 2008

(87) PCT Pub. No.: WO2006/133775

PCT Pub. Date: Dec. 21, 2006

(65) Prior Publication Data

US 2009/0039965 A1    Feb. 12, 2009

(30) Foreign Application Priority Data

Jun. 16, 2005   (DE) .................. 10 2005 027 945

(51) Int. Cl.
    *H03F 3/14* (2006.01)
(52) U.S. Cl. ...................................... 330/297; 330/307
(58) Field of Classification Search .................. 330/297, 330/302, 306, 307
    See application file for complete search history.

(56) References Cited

U.S. PATENT DOCUMENTS

| 4,924,293 | A | 5/1990 | Saito et al. |
| 5,801,091 | A | 9/1998 | Efland et al. |
| 6,177,841 | B1 | 1/2001 | Ohta et al. |
| 2002/0196085 | A1* | 12/2002 | Nakamata et al. ........... 330/302 |
| 2006/0121874 | A1 | 6/2006 | Block et al. |

FOREIGN PATENT DOCUMENTS

| DE | 10321247 | 12/2004 |
| EP | 0 521 739 | 12/1996 |
| EP | 1 347 572 | 9/2003 |

OTHER PUBLICATIONS

English translation of the Written Opinion for PCT/EP2006/004398.
Search Report from corresponding PCT Application No. PCT/EP2006/004398, mailed Jul. 20, 2006, 4 pages.
Written Opinion from corresponding PCT Application No. PCT/EP2006/004398, mailed Jul. 20, 2006, 4 pages.

* cited by examiner

*Primary Examiner*—Steven J Mottola
(74) *Attorney, Agent, or Firm*—Fish & Richardson P.C.

(57) ABSTRACT

An electrical component includes an amplifier that includes an output stage, and a power-supply path for powering the output stage. The power supply path includes a line that includes conductor track sections in parallel. The electrical component also includes a carrier substrate containing the amplifier and the line with the conductor tracks.

20 Claims, 3 Drawing Sheets

LOW-LOSS ELECTRICAL COMPONENT WITH AN AMPLIFIER

BACKGROUND

A low-loss component including an amplifier is known, for example, from the publication DE 10321247 A1. The component includes an impedance converter, which is composed of a line section, whose length corresponds, for example, to a 90° phase rotation of the signal.

SUMMARY

An electrical component with an amplifier is specified which has an output stage. For powering the output stage of the amplifier, a power-supply path is provided in which a line is arranged that has conductor track sections connected in parallel.

By connecting various conductor track sections in parallel, it is possible effectively to increase the line cross section relative to a line with only one such line section and thus to achieve a low line resistance for a direct current. The parallel connection of conductor track sections also increases the current-carrying capacity of the line.

Especially advantageous is a variant of the component in which the amplifier is arranged on a carrier substrate in which the line is formed.

The carrier substrate may be a multilayer substrate with dielectric layers, e.g., made from a laminate or ceramic and metallization planes arranged in-between, in which, in particular, conductor track sections of the line and ground areas are formed. In one variant, the conductor track sections are each arranged in a separate metallization plane. The first ends of these conductor track sections are all connected electrically to each other by first via contacts. The second ends of these conductor track sections are all connected electrically to each other by second via contacts.

It is advantageous if the material of the dielectric layers has a high relative dielectric constant $\in_r > 7$. Here, the electrical length of the line is especially short.

The line is used, on the one hand, as a supply line between a power source and the output stage of the amplifier. On the other hand, at the operating frequency of the amplifier, via the aforementioned line, the signal output of the amplifier should be prevented from reaching the power source. Thus, it is provided that the line is effective at this frequency as a high-frequency line.

A high-frequency line includes a signal line, at least one reference-potential conductor, which can be constructed as a ground conductor or a ground area, and also a dielectric layer arranged between the signal conductor and the corresponding reference-potential conductor.

At least one of the conductor track sections arranged one above the other lies opposite a ground area or a ground conductor. This conductor track section forms an HF-active part of the line.

The conductor track sections are constructed in terms of their parameters, such as thickness, width, length, and, optionally, distance to the ground area, so that the HF-active part of the line acts at the operating frequency of the amplifier as a $\lambda/4$ line, whereby the line overall has a low impedance for a direct-current signal.

Due to the stacked arrangement of conductor track sections of the line or due to the distribution of line parts over several planes, it is possible to construct a surface-mountable component with a small surface area in which the line is already integrated. Thus, the formation of one line in an external conductor plate on which the component is mounted can be eliminated.

The amplifier may be a power amplifier, which is arranged in a signal path constructed as a transmission path. The amplifier may have several stages. In a variant, three amplifier stages are provided. The output stage may be powered by a separate power-supply path, i.e., independent of the preceding amplifier stages.

The specified electrical component is provided, in particular, as a transmission module, but can also be realized as a transceiver module.

The amplifier may be realized as a semiconductor chip or a bare die and can be connected, e.g., via bonding wires or in flip-chip technology to contact areas of the carrier substrate. The inductance of the bonding wires or bumps can each be integrated as a circuit element into a matching network or a low-pass filter.

On the top side of the substrate, additional chip components, e.g., at least one filter, one duplexer, and/or at least one changeover switch, are arranged. The filter can be, e.g., a bandpass filter arranged in a reception path and working with acoustic waves. The component can further include a diplexer and/or at least one (additional) low-pass filter, which each may be formed in the carrier substrate. A diplexer or low-pass filter, however, can also be provided as a surface mountable chip component. A bare-die construction could also be provided.

The low-loss electrical component with an amplifier will now be explained with reference to schematic figures that are not true to scale.

DETAILED DESCRIPTION

Figure 1:
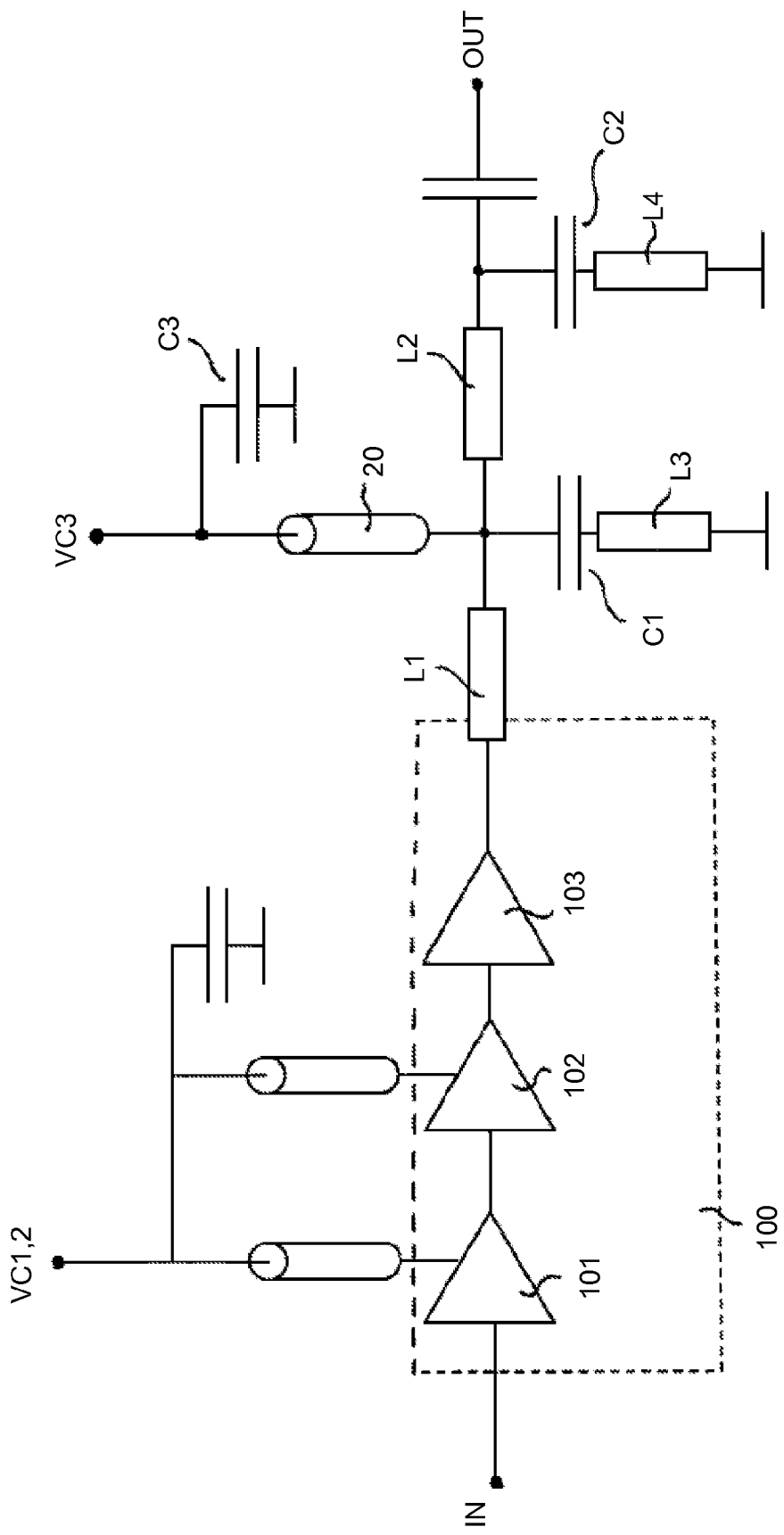
FIG. 1, the equivalent circuit diagram of an electrical component with an amplifier and a line in the power-supply path of the output stage of the amplifier.

FIG. 1 shows a circuit realized in the electrical component with a signal path arranged between the input IN and the output OUT of the component. In the signal path there is an amplifier 100, which has three amplifier stages 101, 102, and 103. The amplifier stages 101 and 102 are powered with a power-supply voltage Vc1, 2 through a common power-supply path. The last amplifier stage 103 is powered independently with a power-supply voltage Vc3.

The amplifier 100 may be a power amplifier, which is used for amplifying a transmission signal. The amplifier 100 is formed in the variant presented in FIG. 2 as a bare die, which is fixed on the top side of a carrier substrate 300 and which is connected electrically to contact areas 51 of the carrier substrate 300 via bonding wires 10.

In the power-supply path of the output stage 103 of the amplifier 100 there is a line 20, which may be a $\lambda/4$ line at the operating frequency of the amplifier. Between this power-supply path and ground, a capacitor is connected which forms a short circuit for high-frequency signals that is transformed into an open circuit by the $\lambda/4$ line. Thus, the power-supply path for the output signal of the amplifier is blocked, wherein signal losses can be avoided.

The carrier substrate 300 has several dielectric layers, which are each arranged between two metallization planes. The dielectric layers may be made from a laminate or ceramic. LTCC ceramics (Low Temperature Cofired Ceramics) or HTCC ceramics (High Temperature Cofired Ceramics) can be considered. The metallization planes each include structured conductor tracks which realize circuit elements, e.g., a capacitor, an inductor, or a line, especially conductor track sections of the line 20.

Figure 2:
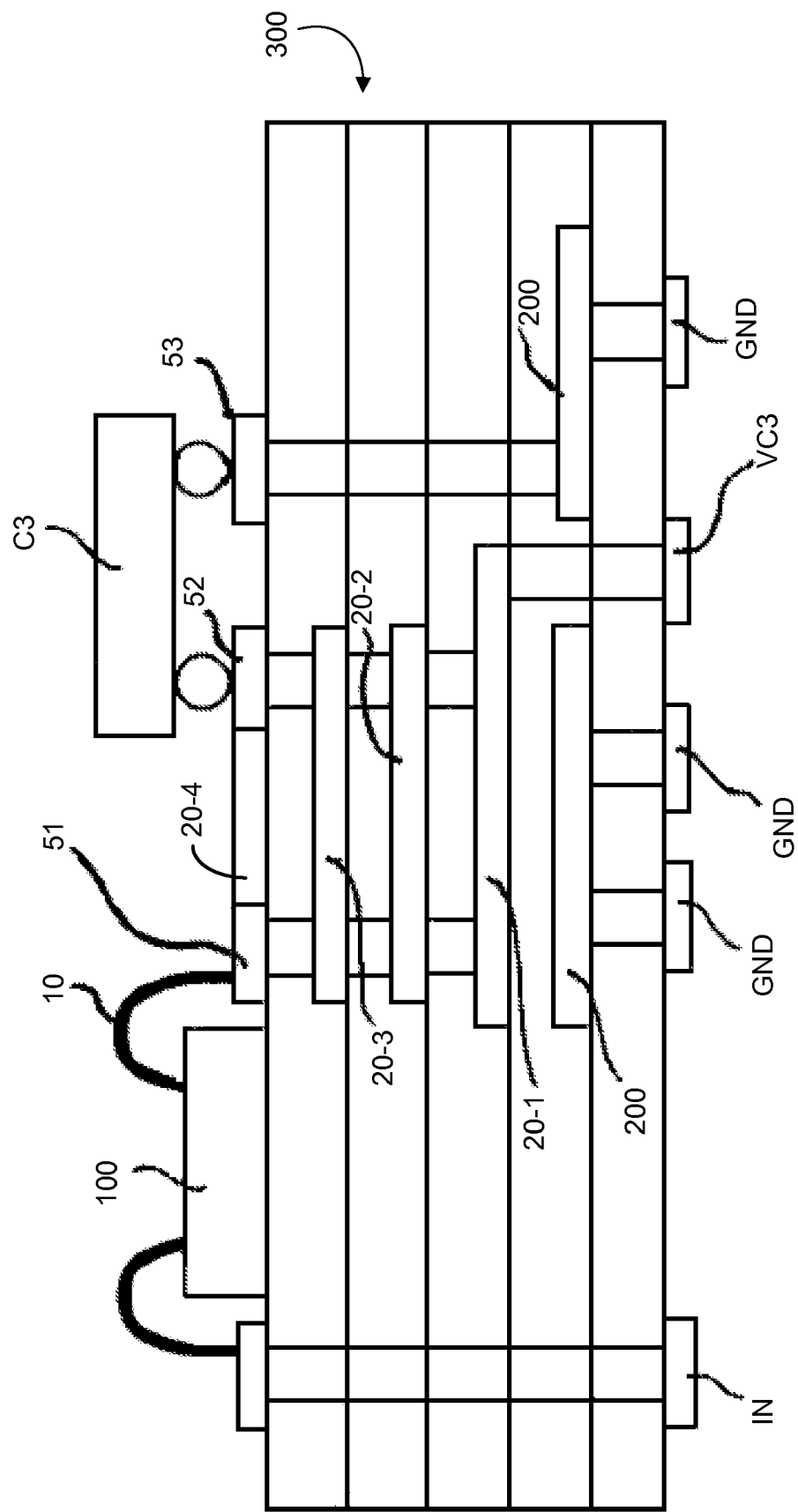
FIG. 2, the cross section of the component with a multilayer carrier substrate.
Figure 3:
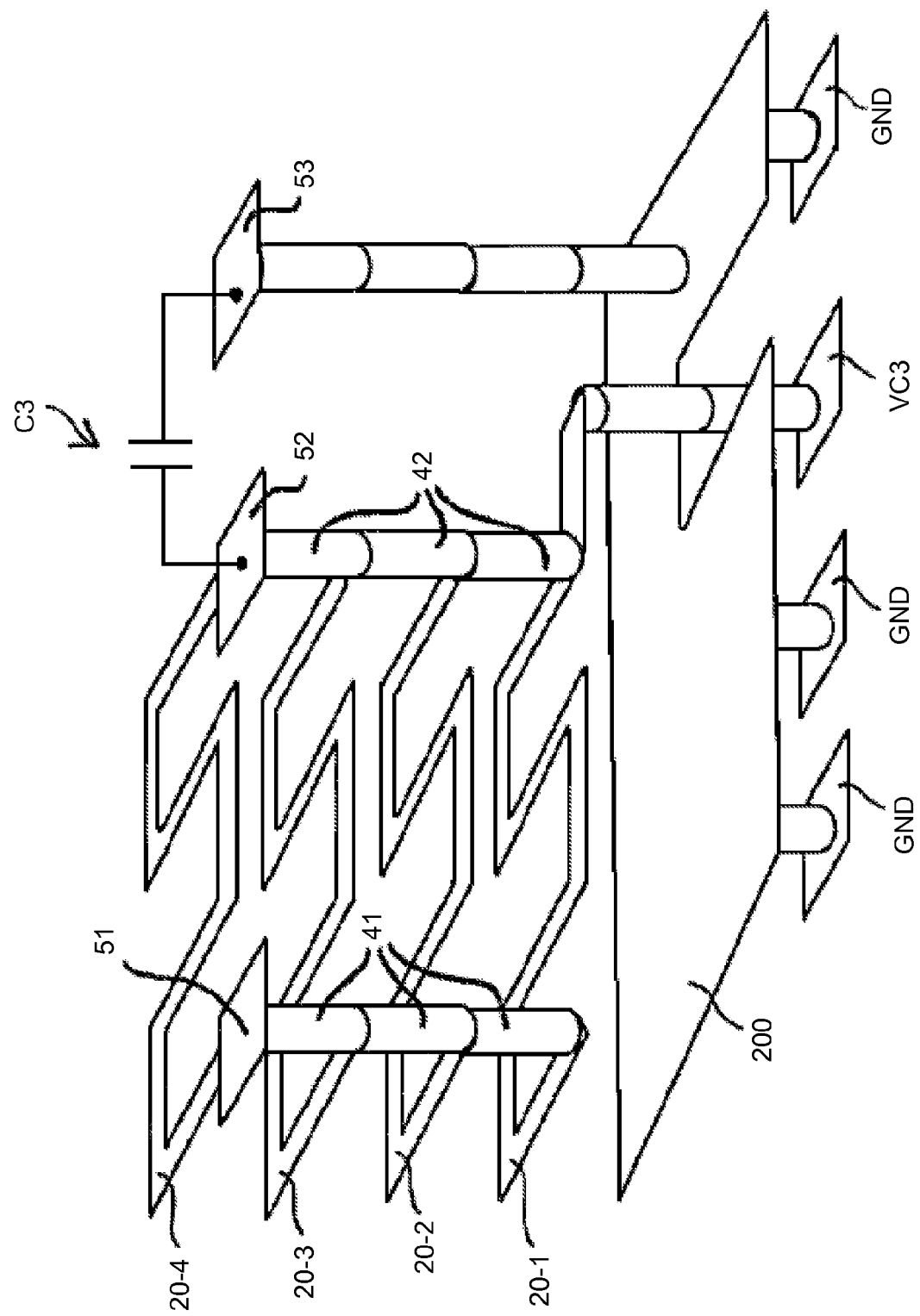
FIG. 3, a perspective view of the metallization planes of the component according to FIG. 2.

The line 20 comprises at least two, in the embodiment shown in FIGS. 2 and 3 four, conductor track sections 20-1, 20-2, 20-3, and 20-4 connected in parallel. The number of conductor track sections, however, is not limited to four. The conductor track sections 20-1, 20-2, 20-3, and 20-4 are each folded in a meander-like shape and arranged in a separate metallization plane. Their first ends are connected electrically to each other via first via contacts 41 and their second ends by via second via contacts 42. The line with conductor track sections connected in parallel is distinguished by a low direct-current resistance and a high current-carrying capacity.

The amplifier output is connected to a low-pass filter, which is constructed here as a π-element. The low-pass filter includes an inductor L2 arranged in the signal path and also series oscillating circuits, which are arranged in shunt arms and which are formed by capacitors C1 and C2 and inductors L3 and L4. The low-pass filter may be integrated in the carrier substrate 300, wherein the inductor L2 and the capacitors C1 and C2 are formed in the metallization planes as structured conductor tracks or conductor areas. The inductors L3 and L4 are, e.g., parasitic inductors of the via contacts.

The values of the capacitor C1 and the inductor L3 may be such that the resonance frequency of the first series oscillating circuit C1, L3 connected directly to the amplifier output essentially matches the frequency of the first harmonic of the usable amplifier signal. The values of the capacitor C2 and the inductor L4 may be such that the resonance frequency of the second series oscillating circuit C2, L4 essentially matches the frequency of the second harmonic of the usable amplifier signal.

Between the amplifier output and the low-pass filter there is a matching element, the inductor L1. For an amplifier chip 100 bonded with wires as in FIG. 2, this inductor is determined mainly by the inductance of a bonding wire 10, which connects the amplifier output to a contact area 51 of the carrier substrate 300. The inductor L1 can also be formed at least partially by a line section between the amplifier and the low-pass filter. This line section can be formed by a conductor track formed, e.g., in the topmost metallization plane of the carrier substrate 300 (see FIGS. 2 and 3) and/or by a via contact.

In one metallization plane of the carrier substrate 300, a ground area 200 is arranged, which lies opposite the conductor track section 20-1. This part of the line 20 is active as a high-frequency line for the usable signal of the amplifier to be suppressed in the power-supply path of the output stage 103. The ground area is connected electrically by via contacts and thermally to the ground connections GND arranged on the bottom side of the component.

On the top side of the carrier substrate, thus, in the topmost metallization plane there are contact areas 51-53 for forming contacts of the amplifier 100 and a chip capacitor, in which the capacitor C3 is realized. The chip capacitor may be surface mountable. In one variant not shown here, it is alternatively possible to form the capacitor C3 in metallization planes of the carrier substrate 300.

In the variant shown in FIGS. 2 and 3, a part of the line 20 is arranged on the substrate top side. In another variant, it is possible to form all of the conductor track sections of the line 20 connected in parallel in the metallization layers lying on the inside in the substrate.

The specified component is not limited to the presented embodiment and the number of shown circuit elements. The chip components arranged on the substrate top side can be selected, in principle, from a surface-mountable component, a wire-bonded bare die, or a component in flip-chip construction. These chip components can be encapsulated via a compound material and/or housed together or independently of each other, e.g., via a cover.

The invention claimed is:

1. An electrical component comprising:
   an amplifier comprising an output stage;
   a power-supply path for powering the output stage, the power supply path comprising a line comprising conductor track sections connected in parallel;
   a carrier substrate containing the amplifier and the line, the line being buried, at least partially, in the carrier substrate; and
   a low-pass filter that is in the carrier substrate and that is electrically connected to a path that receives an output of the amplifier, the low-pass filter comprising series oscillating circuits, each of the series oscillating circuits comprising a capacitor and an inductor in a shunt arm;
   wherein values of a capacitor and an inductor of a first one of the series oscillating circuits are such that a resonance frequency of the first one of the series oscillating circuits corresponds to a frequency of a first harmonic of a signal of the amplifier;
   wherein values of a capacitor and an inductor of a second one of the series oscillating circuits are such that a resonance frequency of the second one of the series oscillating circuits corresponds to a frequency of a second harmonic of the signal of the amplifier; and
   wherein lengths of the conductor track sections are such that the line has a lower impedance for a direct-current signal and a higher impedance for a high-frequency signal at an operating frequency of the amplifier.

2. The electrical component of claim 1, wherein the line comprises a $\lambda/4$ line at an operating frequency of the amplifier.

3. The electrical component of claim 1, wherein the carrier substrate comprises:
   at least three metallization planes; and
   dielectric layers among the at least three metallization planes.

4. The electrical component of claim 3, wherein conductor track sections of the line are in separate metallization planes and corresponding ends of the conductor track sections are interconnected using via contacts.

5. The electrical component of claim 1, wherein the conductor track sections have meander-like shapes.

6. The electrical component of claim 1, further comprising a capacitor between the line and ground.

7. The electrical component of claim 6, wherein the capacitor is part of a chip that is mounted on the carrier substrate.

8. The electrical component of claim 1, wherein circuit elements of the low-pass filter comprise conductor sections in metallization planes of the carrier substrate.

9. The electrical component of claim 1, wherein the carrier substrate comprises dielectric layers comprised of ceramic.

10. The electrical component of claim 1, further comprising a bandpass filter mounted on the carrier substrate.

11. The electrical component of claim 1, further comprising a bandpass filter associated with the carrier substrate.

12. The electrical component of claim 1, further comprising a changeover switch mounted on the carrier substrate.

13. The electrical component of claim 1, which is configured for surface mounting.

14. An electrical component comprising:
   an amplifier comprising an output stage;
   a power-supply path for powering the output stage, the power supply path comprising a line comprising conductor track sections connected in parallel;
   a carrier substrate containing the amplifier and the line, the carrier substrate comprising metallization planes and comprising dielectric layers comprised of ceramic;
   wherein conductor track sections of the line are in separate metallization planes of the carrier substrate and corresponding ends of the conductor track sections are interconnected using via contacts; and
   wherein at least one of the conductor track sections is opposite a ground area or a ground connection.

15. The electrical component of claim 14, wherein the line comprises a $\lambda/4$ line at an operating frequency of the amplifier.

16. The electrical component of claim 14, wherein the carrier substrate comprises:
   at least three metallization planes; and
   dielectric layers among the at least three metallization planes.

17. The electrical component of claim 14, wherein the conductor track sections have meander-like shapes.

18. The electrical component of claim 14, further comprising a capacitor between the line and ground.

19. The electrical component of claim 18, wherein the capacitor is part of a chip that is mounted on the carrier substrate.

20. The electrical component of claim 14, further comprising:
   a low-pass filter that is in the carrier substrate and that is electrically connected to a path that receives an output of the amplifier, the low-pass filter comprising series oscillating circuits, each of the series oscillating circuits comprising a capacitor and an inductor in a shunt arm;
   wherein circuit elements of the low-pass filter comprise conductor sections in metallization planes of the carrier substrate.

\* \* \* \* \*